United States Patent [19]

Naito et al.

[11] Patent Number: 5,193,682
[45] Date of Patent: Mar. 16, 1993

[54] WAFER BASKET

[75] Inventors: Naoki Naito; Naoyuki Takamatsu, both of Fukushima; Toshio Ishikawa, Saitama; Kazunori Koshikawa, Miyagi, all of Japan

[73] Assignee: Shin-Etsu Handotai Co., Ltd., Tokyo, Japan

[21] Appl. No.: 724,980

[22] Filed: Jun. 28, 1991

[51] Int. Cl.⁵ .................... B65D 85/48; B05C 13/02
[52] U.S. Cl. .................... 206/454; 118/500; 211/41
[58] Field of Search .......... 118/500, 728, 729; 211/41; 206/454, 456, 328

[56] References Cited

U.S. PATENT DOCUMENTS

| | | | |
|---|---|---|---|
| 4,566,839 | 1/1986 | Butler | 206/454 X |
| 4,614,268 | 9/1986 | Chlebina et al. | 206/454 X |
| 4,724,963 | 2/1988 | Mortensen | 206/454 |
| 4,779,732 | 10/1988 | Boehm et al. | 206/454 |
| 4,809,641 | 3/1989 | Plissonnier | 118/500 |
| 4,872,554 | 10/1989 | Quernemoen | 206/454 |
| 4,949,848 | 8/1990 | Kos | 211/41 |
| 5,011,041 | 4/1991 | Kakizaki | 118/500 X |

Primary Examiner—Jimmy G. Foster
Assistant Examiner—Jacob K. Ackun, Jr.
Attorney, Agent, or Firm—Whitham & Marhoefer

[57] ABSTRACT

A wafer basket in which the recesses provided for the engagement with the basket lifter are each formed with a dent at the upper and innermost corner of the recess, and a pair of stays are provided at the lower bent portions of the side walls in a manner such that the upper edges of the stays are of the same height and elevated to the extent that the downward movement of the wafers is checked by the stays rather than by the ribs.

2 Claims, 6 Drawing Sheets

WAFER BASKET

BACKGROUND OF THE INVENTION

The present invention relates to a wafer basket for holding and transporting a large number of semiconductor wafers. More particularly, the invention relates to a wafer basket which is designed to improve cleaning and drying conditions for the wafers held in it.

Prior Art

A wafer basket is a box-like rack for containing semiconductor wafers, and is commonly molded integrally of PFA (a copolymer synthesized from perfluoroalkylvinyl ether and tetrafluoroethylene), which is an excellent material in chemical resistance and heat resistance. In construction the wafer basket comprises numerous shelves for receiving wafers in a row, each shelf consisting of a groove defined by a pair of neighboring partition ribs which ribs are formed at regular intervals. The wafer basket is also a vehicle means for transporting the wafers it contains.

A typical conventional wafer basket is described as follows. Being box-like, a wafer basket has four walls, of which two are called side walls. The other two walls parallel to each other are called a front wall and a rear wall, respectively. The side walls are also parallel to each other except for the lower portions where they are bent and curved inwardly in a manner such that a wafer-sized circle may be roughly inscribed to the inner surface of the side walls. The inner surface of the side walls are formed with partition ribs, and each pair of neighboring partition ribs define a groove therebetween suitable for receiving the edge portion of a wafer and the wafers thus received are constrained to stand at regular intervals and parallel to the front and rear walls. The wafer basket has no top or bottom walls, but the lower bent portions of the side walls provide a support means so that the wafers do not fall through the wafer basket. Thus, each groove in the bent portions of the side walls holds the wafer between the ribs, and the wafer received fits therein in a manner such that considerable portions of the edge of the wafer which are inside the grooves formed in the curved portions of the side walls are in contact with the bottoms or the side slopes of the grooves between the ribs. Thus, the downward movement of the wafers is checked by the ribs.

Also, the conventional wafer basket is provided with four recesses each at the four top corners, that is, at either top lateral end of the side walls. The recesses are formed in a shape such that they can engage with the hooks of a basket lifter. Thus hooked by the hooks of the basket lifter, the wafer basket is lifted, transported, steeped in a treatment liquid or a cleaning liquid, and suspended in the air for various treatments.

Problems the Invention seeks to solve

However, in the conventional wafer basket as described above, the grooves formed in the lower portions of the side walls are formed in a manner such that the diameter of the circular arcs traced by each curved groove is roughly identical to the diameter of the wafer to be received [ref., for example, Japanese Published Patent Kokoku No. 53-38591 (1978)], so that considerable lengths of the peripheral edge of the wafer are inevitably contacted by the bottoms or the side slopes of the grooves defined between the ribs, with the result that during the cleaning operations of the wafers the edges contacted by the ribs or the groove bottoms are only poorly cleaned, and furthermore when the wafer basket is lifted from a cleaning liquid such as deionized water (DI water), the liquid is liable to stay between the edge of the wafer and the ribs so that during the vapor drying operation the remnant liquid leaves stains and particles at the edge of the wafer and prevents proper drying thereof. As a result, the yield of the semiconductor chips obtained from the wafers is reduced and the reliability of the product quality becomes lower.

Also, with the conventional wafer basket, there has been a fear that when the wafer basket undergoes a quick motion, the recesses formed at the top lateral end portions of the side walls are disengaged from the hooks of the basket lifter.

SUMMARY OF THE INVENTION

This invention was invented in view of the foregoing circumstances, and it is an object of the invention to provide a wafer basket which is so constructed that the wafers contained therein are secure from the problems of poor cleaning and drying and thus are free from stains, and also that the engagement of the wafer basket with the hooks of the basket lifter is so secure that however quickly the wafer basket may be moved, the basket lifter does not let go the wafer basket.

Means to solve the Problems

In order to attain the objects of the invention, a wafer basket was newly designed. According to the inventive design, although the wafer basket is molded integrally of a resin such as PFA like the conventional wafer baskets, it differs from the conventional wafer baskets in that each recess formed at either top lateral end of the side walls is formed with a dent in its ceiling along the upper and innermost corner of the recess; and that a pair of stay means are provided at the lower bent portions of the side walls in a manner such that the stay means are passed in the direction normal to the front and rear walls and extending from the front wall to the rear wall and also such that the upper edges of the stay means are of the same height and elevated to the extent that the downward movement of the wafers is checked by the stay means and not by the ribs.

Preferably, the upper edges of the stay means are roughly semicircular when seen in their cross section cut by a plane parallel to the front and rear walls.

Effects of the Invention

According to the invention, a dent is provided in the ceiling of, and along the upper and innermost corner of the recess formed at either top lateral end of the side walls so that the dent provides a catch for the hook of the basket lifter if the hook is formed with an appropriate protrusion at its upper tip end, with the result that the dent cooperates with the protrusion to form a clicking mechanism. Thus, however quickly the wafer basket may be moved, the basket lifter does not drop the wafer basket.

Also, since the stay means are provided to support the wafers and prevent considerable lengths of the wafer edges from touching the ribs formed in the lower portions of the side walls, the wafers mounted on the stay means are virtually in point contact with the stay means; consequently, the edges of the wafers are cleaned well during the cleaning operations, and little cleaning liquid stays on the wafers when the wafer basket is lifted from the cleaning liquid so that no stains are formed during the vapor drying operation. As a result, the wafers are dried properly and are not contaminated with particles with the result that the yield of the semiconductor chips obtained from the wafers is improved and the reliability of the product quality becomes higher.

DETAILED DESCRIPTION OF THE INVENTION

Next, an embodiment of the wafer basket of the invention will be described in detail with reference to the attached drawings.

A wafer basket 1 according to the present invention has side walls 2-1 and 2-2 opposed to each other, and a front wall 3-1 and a rear wall 3-2 which are opposed to each other and are connected to the side walls via the vertical sides thereof. The wafer basket 1 is topless and bottomless. Incidentally, the wafer basket 1 is molded integrally of PFA, like the conventional wafer baskets.

Figure 1:
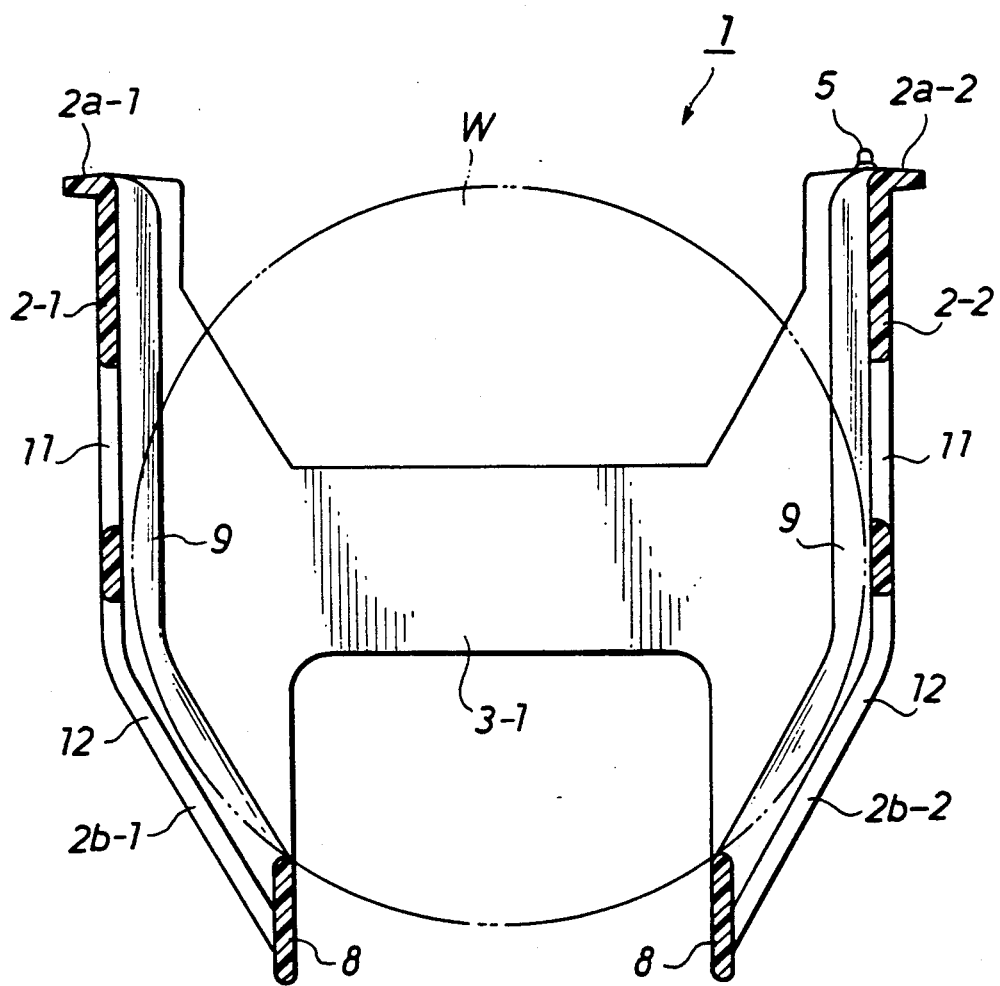
FIG. 1 is a longitudinal sectional view of a wafer basket according to the invention (taken on line I—I in FIG. 2)
Figure 4:
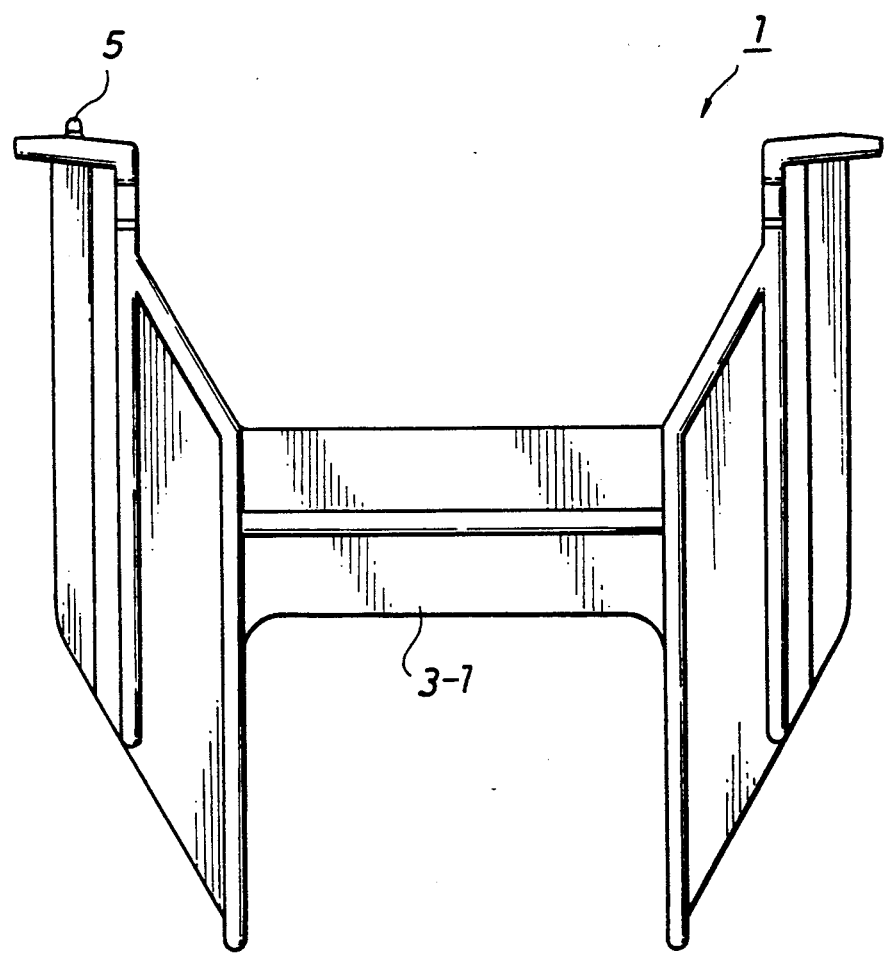
FIG. 4 is a front view of the same wafer basket as seen in the direction of the arrow IV in FIG. 3.
Figure 5:
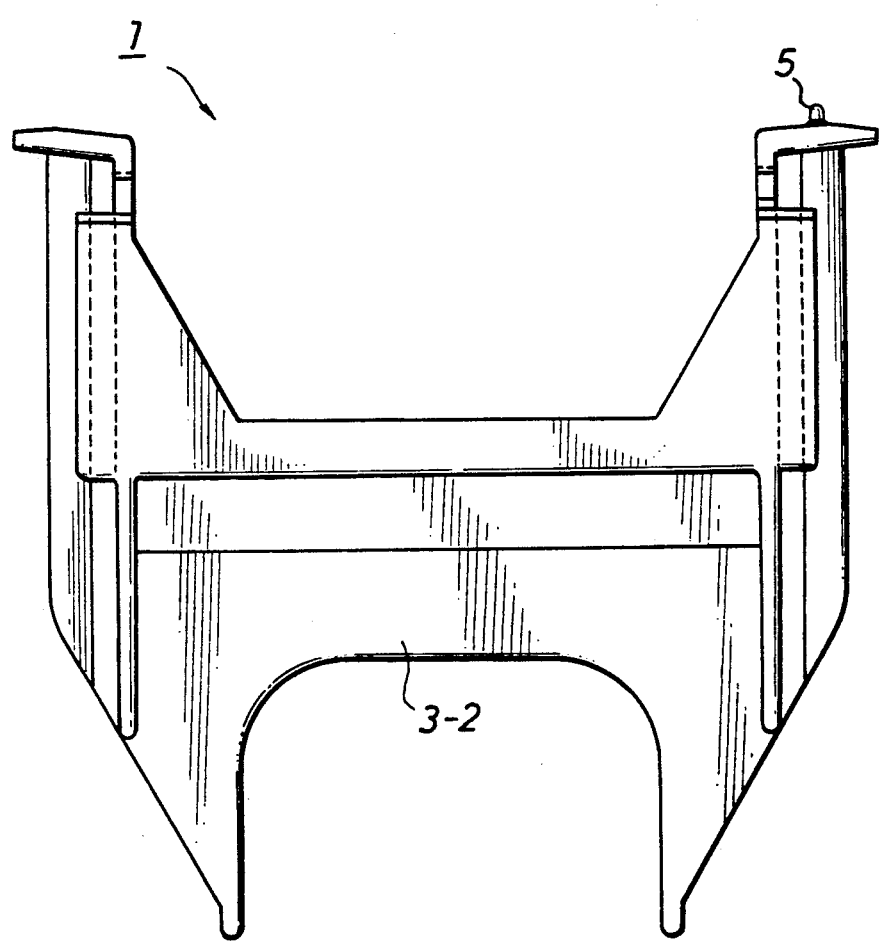
FIG. 5 is a rear view of the same wafer basket as seen in the direction of the arrow V in FIG. 3.

In this embodiment of the invention, the upper and lower portions of the front wall 3-1 and the rear wall 3-2 are substantially eliminated such that the front and the rear walls look like a letter "H" (ref. FIGS. 4 and 5). The purpose of this design is that thereby it is possible to reduce the amount of PFA required to mold the wafer basket 1 and thus to reduce the manufacturing cost as well as to reduce the weight of the wafer basket 1. Also, to reduce the amount of PFA is desirable from the viewpoint of contamination, since, however well the PFA wafer basket may be cleaned by means of the best method known up to date, PFA itself constitutes a source of contamination for the wafers especially by providing particles that stick to the wafers (ref. FIG. 1).

Figure 2:
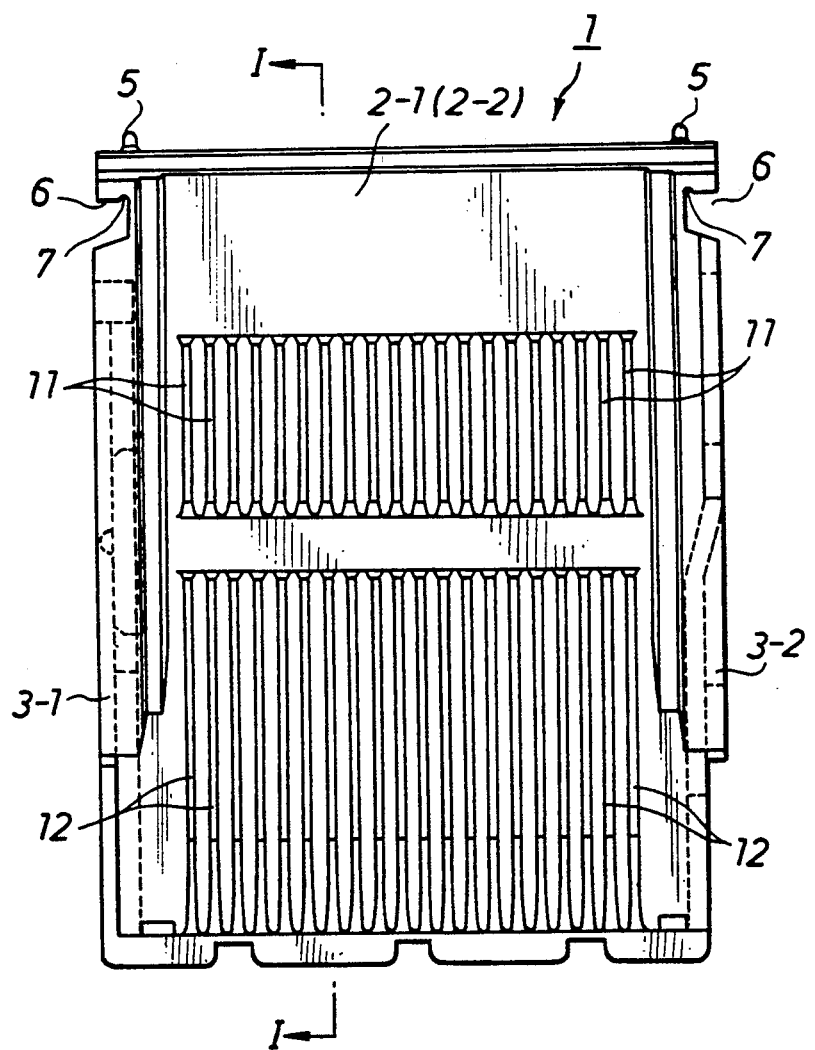
FIG. 2 is a side view of the same wafer basket.
Figure 3:
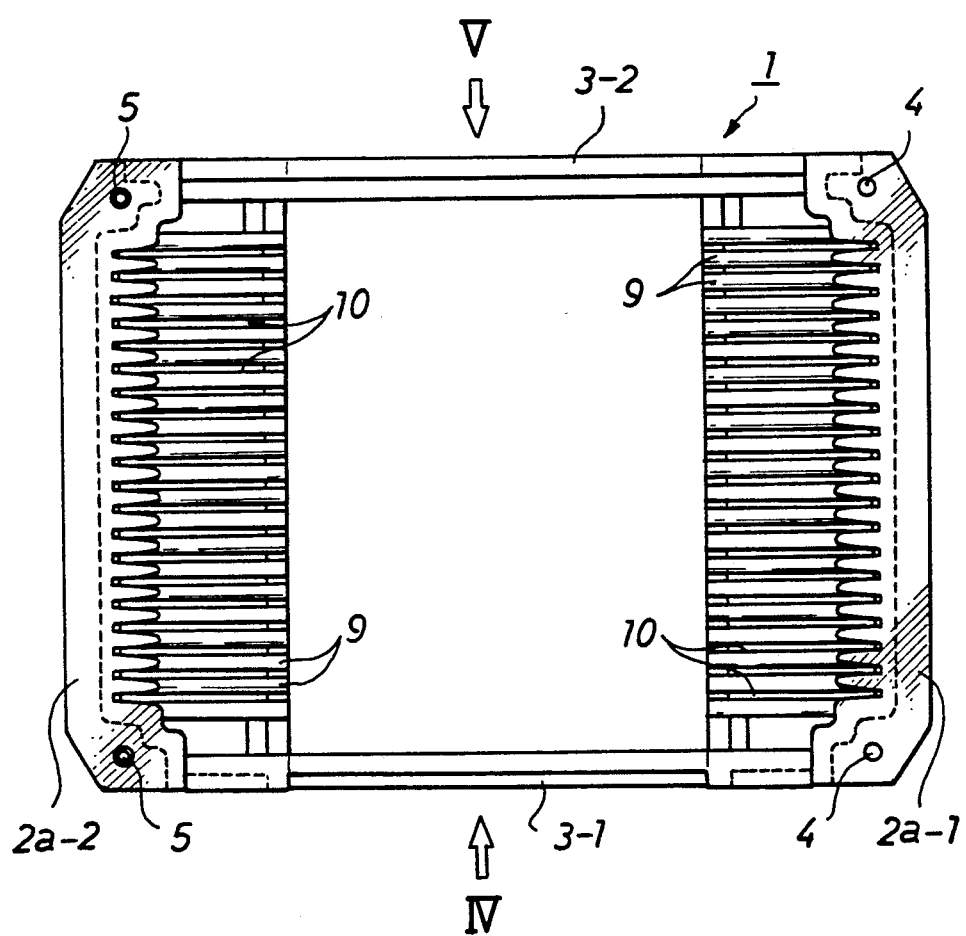
FIG. 3 is a top plan view of the same wafer basket.
Figure 7:
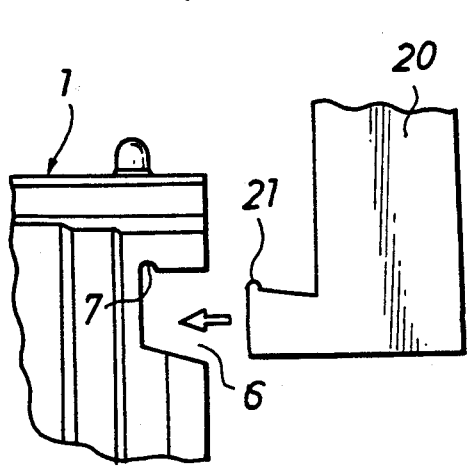
FIG. 7(a) is a side view of a side wall of the same wafer basket before the recess of the side wall of the wafer basket is engaged with a hook of a basket lifter.
FIG. 7(b) is a view similar to FIG. 7(a) after the recess of the side wall of the wafer basket is engaged with a hook of a basket lifter.
Figure 7:
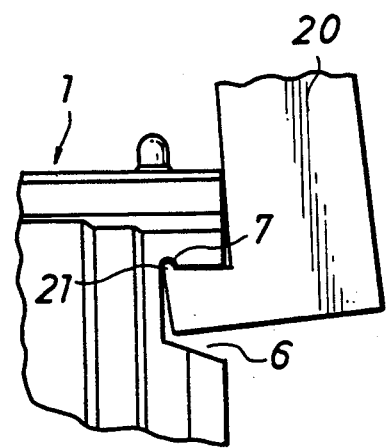

The side walls 2-1 and 2-2 are provided with flanges 2a-1 and 2a-2, respectively, which extend horizontally outward from the upper edges of the side walls. As shown in FIG. 3, a small circular bore 4 is provided at either end of the flange 2a-1, for positioning the wafer basket 1. Also, for the same purpose, the other flange 2a-2 is provided with a small round-topped protrusion 5 at either end thereof. As shown in FIG. 2, a recess 6 is formed at either top lateral end of the side walls 2-1 and 2-2. The ceiling of the recess 6 is horizontal and the bottom thereof is slanted such that the recess diverges toward the entrance. The ceiling of the recess 6 is provided with a dent 7 at the innermost corner, as shown in detail in FIG. 7. The dent provides a catch for the hook of a basket lifter 20, if the hook is formed with an appropriate protrusion 21 at its upper tip end, with the result that the dent 7 cooperates with the protrusion 21 to produce a clicking mechanism.

As shown in FIG. 1, the side walls 2-1 and 2-2 are bent inwardly at the lower portions thereof in a manner such that a wafer-sized circle may be roughly inscribed to the inner surface of the bent side walls; and a plate-like stay 8 is provided at the lower end of either bent side wall, 2b-1, 2b-2, in a manner such that each stay 8 is passed in the direction normal to the front and rear walls 3-1, 3-2, and extending from the front wall 3-1 to the rear wall 3-2. The profile of the upper edge of each stay 8 is semicircular as viewed in FIG. 1.

The Inner surface of either side wall 2-1, 2-2 is formed with wafer-partition ribs 9 each extending from the top of the side wall to the respective stay 8. The ribs 9 (nineteen ribs in this embodiment, as seen in FIG. 3) are arranged in a row at regular intervals from the front wall 3-1 to the rear wall 3-2; and the ribs formed on the side wall 2-1 are in mirror symmetry with the ribs formed on the side wall 2-2. Each pair of neighboring ribs 9, 9 define a groove 10 having a width suitable for receiving in it the edge portion of a wafer W. Since the opposing ribs are mirror-symmetrically formed, the grooves defined on the side wall 2-1 are mirror-symmetric with those defined on the side wall 2-2, so that a wafer W can be received in each pair of opposing grooves such that the wafer W is constrained to stand vertically therein. Incidentally, the frontmost and the rearmost ribs define similar grooves in cooperation with the partitionable risings raised from the inside surfaces of the side walls, so that the wafer basket 1 can hold twenty wafers at a time in a manner such that the wafers are arranged between the front and rear walls at regular intervals.

Slit holes 11 are made in the vertical portions of the side walls 2-1 and 2-2, and also slit holes 12 are made in the bent portions 2b-1 and 2b-2 of the side walls such that the slit holes 11 and 12 render the grooves 10 bottomless where the slits are made. These double-decked lengthy slits 11 and 12 provide passages for the treating liquid to enter the wafer basket 1 when the basket is steeped in the treating liquid.

Figure 6:
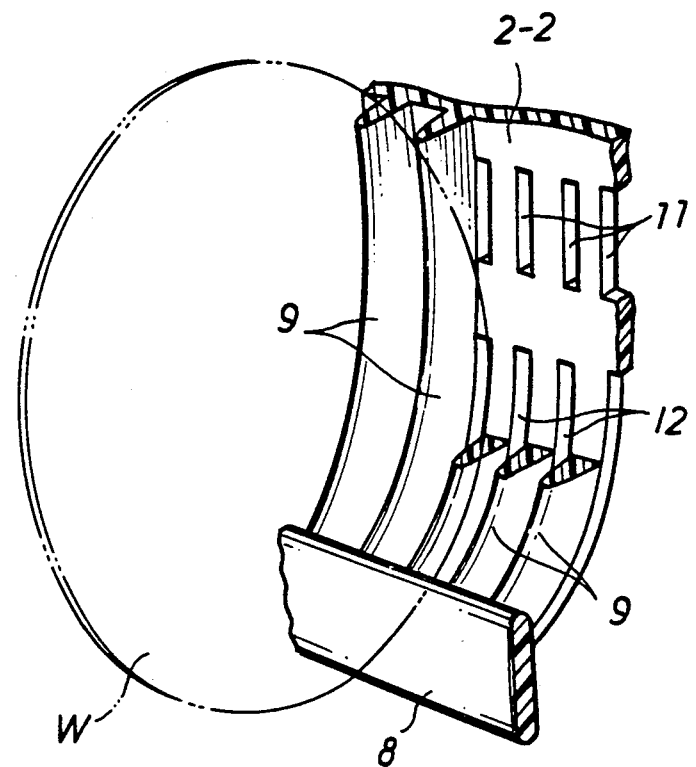
FIG. 6 is a fragmentary perspective view of a side of the same wafer basket seen from the inside.

The wafers W are put into the wafer basket 1 by letting them slide down into the grooves 10 formed in the side walls 2-1, 2-2, from above. Now, the stays 8, 8 are designed such that the upper edges of the stays are of the same height and are sufficiently elevated such that the downward movement of a wafer W is checked by the stay means rather than by the side slopes of the ribs 9 formed in the lower portions of the side walls when the wafer W is inserted in a groove. Therefore, as shown in FIGS. 1 and 6, the wafer W inserted in the groove 10 stays only when it mounts on the upper edges of the stays 8, 8. Since the upper edges of the stays 8, 8, are semicircular in cross section, the wafer W gets in pointwise contact with the stays 8, 8. In this manner twenty wafers W are contained in a row in the wafer basket 1, and they are all isolated from the neighboring ones by the partitioning ribs 9.

Each wafer W is only contacted by the stays 8 and by the ribs 9. However, since the upper edges of the stays 8 are semicircular in cross section, the area of the contact is virtually a point each. Also, since the wafer W is mounted on the stays 8, the contact between the wafer W and the ribs 9 is scanty and temporal. Therefore, during the cleaning operations of the wafers almost the entire surface of each wafer W is readily and sufficiently rinsed by the cleaning liquid, and when the wafer basket 1 is lifted from the cleaning liquid such as deionized water, the liquid scarcely stays on the wafer W so that during the subsequent vapor drying operation few, if any, stains or particles are left on the surface of the wafer W, and thus proper drying of the wafer W is facilitated. As a result, the yield of the semiconductor chips obtained from the wafers is improved and the reliability of the product quality becomes higher.

Also, when the wafer basket 1 full of wafers W is to be lifted and transported by the hooks of the basket lifter 20, each hook of the basket lifter 20 is brought in engagement with the recess 6 provided at the top four corners of the wafer basket 1 as shown in FIG. 7(a) and FIG. 7(b). Since the dent 7 is provided in the recess 6, the protrusion 21 clicks with the dent 7 as the hook engages with the recess 6. By virtue of this click mechanism attained by the cooperation between the dent 7 provided at the innermost upper corner of the recess 6 and the protrusion 21 provided at the upper tip end of the hook, a reliable transportation of the wafer basket 1 is secured.

Although the invention has been described in its preferred form with a certain degree of particularity, it is to be understood that the modifications will occur to those skilled in the art without departing from the spirit of the invention. The scope of the invention is therefore to be determined solely by the appended claims.

What is claimed is:

1. In a wafer basket having a box-like configuration which consists mainly of two side walls facing each other, and a front wall and a rear wall facing and parallel to each other, wherein the lower portions of the side walls are bent inwardly and the inner walls of the side walls are formed with a plurality of ribs arranged at regular intervals to define grooves for reception of wafers, and wherein recesses for engagement with hook means are provided each at either end of the side walls, an improvement comprising:

each said recess being formed with a dent in its ceiling along the upper and innermost corner of said recess; and that a pair of stay means for checking the downward movement of wafers provided at the lower bent portions of the side walls in a manner such that said stay means extend in the direction normal to the front and rear walls and extending from the front wall to the rear wall and also such that the upper edges of the stay means are of the same height and elevated to the extent that the downward movement of the wafers is checked by the stay means and not by the ribs.

2. The wafer basket as claimed in claim 1 wherein the upper edges of the stay means are approximately semicircular when seen in their cross section cut by a plane parallel to the front and rear walls.

* * * * *